Dec. 14, 1965 D. E. MILLINGTON 3,223,560

SEMI-CONDUCTOR CONTROLLED RECTIFIER HAVING
TURN-ON AND TURN-OFF PROPERTIES
Filed July 23, 1962

United States Patent Office 3,223,560

Patented Dec. 14, 1965

3,223,560

SEMI-CONDUCTOR CONTROLLED RECTIFIER HAVING TURN-ON AND TURN-OFF PROPERTIES

David Everitt Millington, Sutton Coldfield, England, assignor to Joseph Lucas (Industries) Limited, Birmingham, England Filed July 23, 1962, Ser. No. 211,674
Claims priority, application Great Britain, Aug. 3, 1961, 28,196/61
1 Claim. (Cl. 148—1.5)

Figure 1:
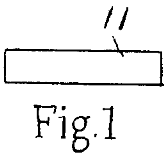

This invention relates to a method of manufacturing a p-n-p-n semi-conductor device of the kind known as a controlled rectifier, the method being of the kind in which an n-type crystal layer is treated to form on opposite sides thereof p-type layers one of which is to act as the anode and the other of which is to act as the gate, a further n-type layer being subsequently formed on part of said other p-type layer to define a peripheral junction therewith, said further n-type layer serving in use as the cathode.

Such devices have the property that they can be switched on by a signal applied to the gate. Moreover, it has recently been discovered that in certain circumstances the devices can be switched off by suitable signals applied to the gate. For a device of this kind, the turn-off gain $\beta$ is defined as the ratio of the current through the device to the gate current required to switch the device off, and it has been shown that:

$$\beta=\frac{\alpha_P}{\alpha_P+\alpha_N}-1$$

where $\alpha_P$ and $\alpha_N$ are the common base current gains of the n-p-n and p-n-p regions respectively, each of these factors depending on the current flowing through the device. The current at which $\alpha_P+\alpha_N=1$ is termed the holding current, and for currents just above the holding current the majority of controlled rectifiers can be switched off by the application of gate current. However, there is a critical value of the current flowing through the device above which the device cannot be switched off by gate current, and this critical value has in the past been sufficiently low to render the switch-off property of controlled rectifiers of little use in power applications.

It has been found that the critical value arises when the current required to switch off the device gives rise to a transverse cathode-gate voltage which is greater than the breakdown voltage or the cathode-gate junction. It has further been found that this breakdown voltage can be increased by etching away the junction between the cathode and gate. Accordingly, the invention resides in a method of the kind specified, characterized in that said peripheral junction is etched away to increase the breakdown voltage of the junction.

Preferably, the transverse gate resistance is reduced by increasing the p-type concentration of the gate before etching the junction. This transverse resistance can also be reduced by shaping the cathode layer to give a large peripheral length for a given area.

In a typical case, the breakdown voltage of the cathode-gate junction can be increased from about 8 volts to about 50 volts.

In the accompanying drawings, FIGURES 1 to 9 respectively are diagrammatic views illustrating nine stages during the manufacture of a controlled rectifier in accordance with one example of the invention. The relative thicknesses of the layers are not drawn to scale.

Referring to the drawings, a wafer 11 (FIGURE 1) is first cut from n-type single crystal silicon with the wafer surface in the 1,1,1, crystal plane. The resistivity of the silicon in a typical case is in the region of 25–50 ohm-cms. The wafer is lapped to a thickness of, for example eleven thousandths of an inch, and then etched to a thickness of ten thousandths in an acid solution comprising by volume:

10 parts concentrated nitric acid
6 parts glacial acetic acid
6 parts hydrofluoric acid (Analar standard)

Figure 2:
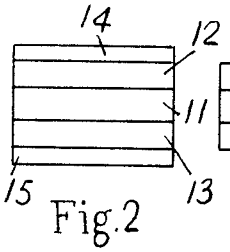
Figures 3, 4:
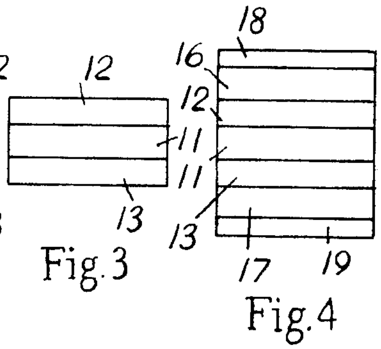

After the etching process, the wafer is placed in a furnace, which is then evacuated to a pressure below $10^{-4}$ millimetres of mercury. The furnace is heated and aluminium vapour is diffused into opposite faces of the crystal to form first and second p-type layers 12, 13 (FIGURE 2). A typical diffusion time is fifteen minutes with the furnace maintained at 1250° C., and the aluminium source at 1000° C., followed by a further nine hours with the source removed and the furnace filled with air at atmospheric pressure. The wafer is then cooled at a rate of about 2½° C. per minute to atmospheric temperature, and then removed from the furnace. The layers 12, 13 are covered by layers 14, 15 of a substance consisting of a mixture of silicon and aluminium oxides formed by oxidation, the layers 14, 15 being subsequently etched away with hydrofluoric acid to give the wafer shown in FIGURE 3.

The wafer is now placed in an open-tube furnace at 1250° C. in an atmosphere of phosphorus pentoxide and air, the furnace being allowed to cool to atmospheric temperature immediately at a rate of 2½° C. per minute. This process results in the formation of thin n-type layers 16, 17 on the p-type layers 12, 13, the n-type layers 16, 17 being themselves covered by glass-like layers 18, 19 (FIGURE 4) consisting of a mixture of silicon and phosphorous oxides formed by oxidation.

Figure 5:
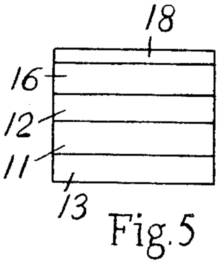
Figure 6:
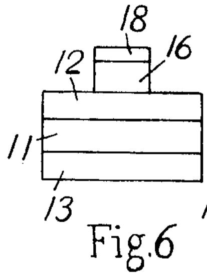
Figure 7:
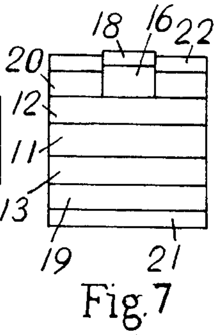
Figure 8:
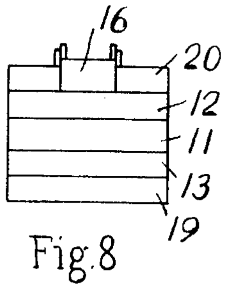

The glass-like and n-type layers 17, 19 covering the second p-type layer are removed by etching first in hydrofluoric acid and then in the above-defined acid mixture, the wafer then appearing as shown in FIGURE 5.

The glass-like and n-type layers 16, 18 are now covered with a protective layer of wax of a predetermined shape, depending on the required shape of the junction between the gate and cathode in the finished rectifier. The unexposed surface is now treated as before to remove portions of the layers 16, 18, the wax then being removed, leaving a crystal of the form shown in FIGURE 6. Preferably, the junction between the gate and the cathode is tortuous in shape, so that a large peripheral length is provided for a given area.

The wafer is now placed in a furnace at 1250° C., and boron vapour is passed over the wafer. Boron diffuses into the wafer except for that portion masked by the glass-like substance. After three hours in this furnace the temperature is allowed to cool at 2½° C. per minute to room temperature. The result of this process is that the p-type layer 13 and the exposed portion of the p-type layer 12 are thickened so as effectively to provide concentrated p-type layers 19, 20 which are coated with glass-like layers 21, 22. The layer 16 may, as shown, extend partly into the layer 20, but need not do so. The junction between the layers 16, 20 is now masked, and the glass removed from the remaining layers by etching in hydrofluoric acid to provide the wafer seen in FIGURE 8. The wafer surface is then sand blasted and nickel plated.

The mask is now removed and the nickel plate is sintered to the wafer in a furnace at a temperature of the order of 800° C. in an atmosphere of, for example, 90% nitrogen and 10% hydrogen. The furnace is allowed to cool slowly. The wafer is now cleaned in hydrofluoric acid and replated with nickel.

Figure 9:
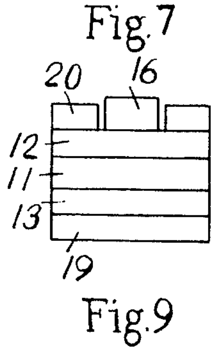

Each wafer is of size sufficient to provide several controlled rectifiers. One of these rectifiers has the glass over the junction etched away, whereafter the junction itself is etched away with the above described acid solution for a period of time not exceeding 40 seconds. The etching of this first rectifier is carried out carefully in discrete time intervals of, say, one second, and after each interval the breakdown voltage of the cathode-gate junction is tested, etching being continued until this voltage reaches a suitable level. Once the exact time for one rectifier has been determined empirically, the remaining rectifiers to be cut from the same wafer are etched for the same time. In a typical case, a controlled rectifier was required to handle current of the order of 5 amps. The junction was etched for 15 seconds, giving a breakdown voltage of 50 volts. The final form of the wafer is shown in FIGURE 9.

The thickness of the layers determine the values of the factors $\alpha_P$, $\alpha_N$ for a given current, and are therefore chosen to give an optimum value of $\beta$. In one example the layer 11 was of thickness 6.5 thousandths of an inch, the p-type anode layer 19, 13, 2.1 to 2.2 thousandths, the p-type gate 12, 20, 1.9 to 2.0 thousandths, and the n-type cathode 16, 0.5 thousandths and extending into the gate by 0.2 thousandths.

Having thus described my invention what I claim as new and desire to secure by Letters Patent is:

In the manufacture of a p-n-p-n semi-conductor device of the kind having an anode, a cathode and a gate, and in which the device can be turned on to permit flow of current between the anode and cathode by a positive pulse applied between the gate and cathode, and can be switched off by a negative pulse applied between the gate and cathode, the method comprising the steps of treating an n-type crystal layer to form on opposite sides thereof p-type layers one of which is to act as said anode and the other of which to act as said gate, subsequently forming on part of said other p-type layer a further n-type layer, masking the n-type layer with a protective coating, removing peripheral portions of the masked layer and the underlying n-type layer around a predetermined area of n-type layer, treating the exposed p-type layer portions to increase its thickness and the p-concentration thereof, removing the masking layer from the balance of the n-type layer, etching the peripheral portion of the n-type layer to penetrate the increased p-concentration layer to at least the surface of the original p-layer to increase the breakdown voltage of said peripheral junction.

References Cited by the Examiner

UNITED STATES PATENTS

| | | | |
|---|---|---|---|
| 2,689,930 | 9/1954 | Hall | 148—186 |
| 2,806,983 | 9/1957 | Hall | 317—235 |
| 2,783,197 | 2/1957 | Herbert | 317—235 |
| 2,877,359 | 3/1959 | Ross | 317—235 |
| 3,020,412 | 2/1962 | Byczkowski | 148—1.5 |
| 3,023,347 | 2/1962 | Strull | 148—187 |
| 3,099,591 | 7/1963 | Schockley | 148—187 |

DAVID L. RECK, *Primary Examiner.*

JAMES D. KALLAM, HYLAND BIZOT, *Examiners.*